United States Patent
Brask

(10) Patent No.: US 6,743,740 B2
(45) Date of Patent: Jun. 1, 2004

(54) USING SONIC ENERGY IN CONNECTION WITH LASER-ASSISTED DIRECT IMPRINTING

(75) Inventor: Justin K. Brask, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/273,474

(22) Filed: Oct. 18, 2002

(65) Prior Publication Data

US 2004/0087186 A1 May 6, 2004

(51) Int. Cl.[7] .................. H01L 21/477; C03C 25/68
(52) U.S. Cl. .......................... 438/795; 216/54
(58) Field of Search ................ 438/584, 589, 438/795, 796, 797, 799; 216/33, 34, 37, 54

(56) References Cited

U.S. PATENT DOCUMENTS

2002/0042027 A1 * 4/2002 Chou et al. .............. 430/322
2003/0062334 A1 * 4/2003 Lee et al. ................. 216/37
2003/0071016 A1 * 4/2003 Shih et al. ................ 216/54

FOREIGN PATENT DOCUMENTS

EP          1003078 A2 *  5/2000  ............ G03F/7/00

OTHER PUBLICATIONS

Michel Freemantle, Nanolithography, Nano structures in Nanoseconds, Ultrafast technique imprints patterns directly in silicon chip, Chemical & Engineering News, vol. 80, No. 25, Jun. 24, 2002.*
Chou et al., Ultrafast and direct imprint of nanostructures in silicon, Nature, vol. 417, Pp. 835–837, Jun. 2002.*
Chou et al., Ultrafast and direct imprint of nanostructures in silicon, Nature, vol. 417, Pp. 835–837, Jun. 2002.*
Wang et al., Direct nanoimprint of submicron light–emitting structures, Applied Physics Letters, vol. 75, No. 15, Pp. 2767–2769, Sep. 1999.*
Chou et al., "Ultrafast and Direct Imprint of Nanostructures in Silicon", Nature, vol. 417, pp. 835–837, Jun. 20, 2002.

* cited by examiner

Primary Examiner—Olik Chaudhuri
Assistant Examiner—Brook Kebede
(74) Attorney, Agent, or Firm—Trop, Pruner & Hu, P.C.

(57) ABSTRACT

A laser-assisted direct imprint process enables direct transfer of patterns on a contact mold to molten semiconductor material. During the pattern transfer, sonic energy may be applied to improve the efficacy of the pattern transfer.

14 Claims, 1 Drawing Sheet

USING SONIC ENERGY IN CONNECTION WITH LASER-ASSISTED DIRECT IMPRINTING

BACKGROUND

This invention relates generally to the manufacture of semiconductor integrated circuits.

It is generally desirable to transfer a pattern repeatedly to a semiconductor wafer in the course of semiconductor manufacturing. Conventionally, this is done using processes involving lithography and etching. However, lithography and etching may tend to be relatively expensive and are limited in their resolution or throughput. Thus, there has been a demand for better ways to transfer patterns repeatedly to semiconductor wafers.

One such technique is called laser-assisted direct imprint (LADI). In this process, a pattern is formed on a quartz mold and the quartz mold with the pattern is pressed against a silicon substrate. An excimer laser irradiates the quartz mold. Due to the irradiation of the quartz mold, the upper surface of the silicon substrate is melted. As a result, the pattern on the mold is transferred to the molten silicon over a relatively short time period, generally less than 250 nanoseconds. After the silicon has solidified, the mold and substrate are separated.

LADI has been used to transfer patterns to structures with resolutions better than 10 nanometers. See Chou, Stephen Y., Keimel, Chris, and Gu, Jian, "Ultrafast and direct imprint of nanostructures in silicon," Nature, 835–837 (2002).

While the techniques of laser-assisted direct imprint show considerable promise, there is still a need for better ways to transfer the pattern to the molten silicon.

DETAILED DESCRIPTION

Using laser-assisted direct imprint, a pattern may be transferred from a quartz contact mold 12 to a silicon wafer 10. The quartz contact mold 12 may have a pattern 14 formed thereon which is to be transferred directly to the silicon wafer 10.

Figure 1:
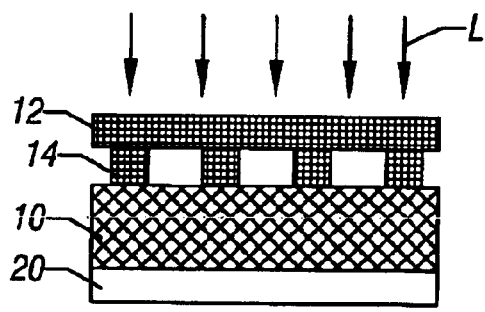
FIG. 1 is a cross-sectional view of one embodiment of the present invention.

A laser pulse, such as a single XeCl excimer laser pulse, may be used to heat a quartz contact mold 12 by exposure to laser irradiation, indicated as L, in FIG. 1. In one embodiment, the laser pulse may be a 308 nanometer wavelength twenty nanosecond pulse that passes through the quartz contact mold 12. The quartz contact mold 12 does not absorb the laser energy because it has a band gap larger than the photon energy.

Figure 2:
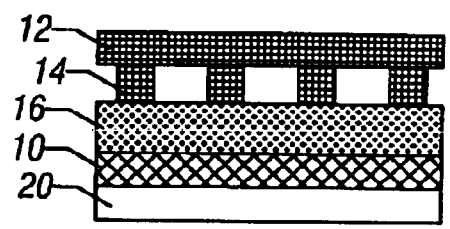
FIG. 2 is a cross-sectional view of the embodiment shown in FIG. 1 at a subsequent stage in accordance with one embodiment of the present invention.

As shown in FIG. 2, a molten layer 16 may be formed as a result of the irradiation. The molten silicon layer 16 may be about 300 nanometers deep and may remain molten for hundreds of nanoseconds in one embodiment of the present invention. Generally, the exposure to radiation occurs for a time between 0 and 250 nanoseconds in some embodiments of the present invention.

During this period of irradiation, the wafer 10 may be subjected to sonic energy through a sonic energy generator 20. The sonic energy generator 20 may be a source of ultrasonic or megasonic energy. The ultrasonic source may use frequencies from 300 to 1000 kilohertz, dissipating about 5 to 10 watts per square centimeter in one embodiment of the present invention.

The application of sonic energy assists in providing good contact between the quartz contact mold 12 and the molten silicon 16. For example, sonic pulses may be applied to break up surface tension forces between the mold 12 and the molten silicon 16. In some embodiments, this may improve the uniformity during fill in of the quartz contact mold 12 with the molten silicon 16. This may result in the ability to transfer patterns having dimensions smaller than 100 nanometers with relatively high aspect ratios, for example, greater than four to one, to the silicon wafer 10.

Figure 3:
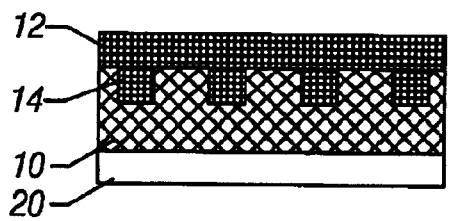
FIG. 3 is a cross-sectional view of the embodiment shown in FIG. 2 at a subsequent stage in accordance with one embodiment of the present invention.

Referring to FIG. 3 with the application of pressure, after the cessation of laser irradiation, the quartz contact mold 12 may emboss the pattern 14 into the molten silicon 16. During this process, sonic energy is applied continuously or in a series of pulses.

Figure 4:
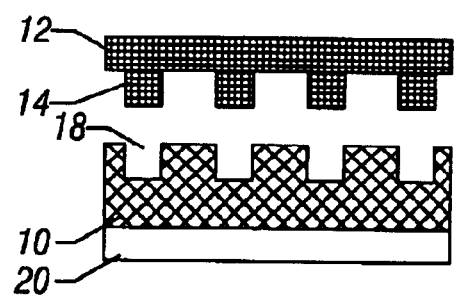
FIG. 4 is a cross-sectional view of the embodiment shown in FIG. 3 at a subsequent stage in accordance with one embodiment of the present invention.

As shown in FIG. 4, after solidification of the molten silicon 16, the quartz contact mold 12 may be separated from the wafer 10 leaving the pattern 18 formed in the wafer 10.

The same process may be applied to other materials, such as polysilicon. Thus, the same techniques may be utilized to directly pattern gates for field effect transistors. The same technique may be utilized for non-silicon based materials, such as germanium, and group III/V and II/VI compound semiconductors and dielectrics using appropriate laser wavelengths.

What is claimed is:

1. A method comprising:

exposing a contact mold in contact with a semiconductor wafer to laser irradiation;

melting at least a portion of the wafer;

causing a pattern on the mold to be transferred to the molten wafer; and applying sonic energy.

2. The method of claim 1 including exposing said wafer to sonic energy after melting at least a portion of said wafer.

3. The method of claim 1 including using sonic energy to break up surface tension between the pattern on said mold and the molten portion of the wafer.

4. The method of claim 1 including pressing the mold into the molten wafer.

5. The method of claim 1 including applying sonic energy in the range of 300 to 1000 kilohertz.

6. A method comprising:

heating a semiconductor structure to a molten state;

pressing a mold having a pattern formed thereon into said molten structure; and applying sonic energy while said mold is in contact with said molten structure.

7. The method of claim 6 including pressing the mold into the molten structure.

8. The method of claim 6 including applying sonic energy in the range of 300 to 1000 kilohertz.

9. The method of claim 6 including forming a molten structure by applying laser irradiation.

10. The method of claim 6 including removing said mold after said structure solidifies.

11. A method comprising:

irradiating a semiconductor structure to melt said semiconductor structure;

pressing a mold into said molten semiconductor structure; and applying sonic energy to reduce the surface tension between said molten semiconductor structure and said mold.

12. The method of claim 11 including applying sonic energy in the range of 300 to 1000 kilohertz.

13. The method of claim 11 including removing said mold from said molten semiconductor structure after said semiconductor solidifies.

14. The method of claim 11 including applying sonic energy while irradiating said structure.

* * * * *